(12) United States Patent
Kim (10) Patent No.: US 8,823,042 B2
(45) Date of Patent: Sep. 2, 2014

(54) ORGANIC LIGHT EMITTING DIODE DISPLAY

(71) Applicant: Samsung Display Co., Ltd., Yongin (KR)

(72) Inventor: Hak-Gyu Kim, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 52 days.

(21) Appl. No.: 13/654,317

(22) Filed: Oct. 17, 2012

(65) Prior Publication Data

US 2013/0341597 A1 Dec. 26, 2013

(30) Foreign Application Priority Data

Jun. 25, 2012 (KR) .................. 10-2012-0068028

(51) Int. Cl.
*H01L 33/00* (2010.01)
(52) U.S. Cl.
USPC .............................. 257/99; 438/23
(58) Field of Classification Search
CPC .................................................. H01L 27/3225
USPC ............................................... 257/99; 438/23
See application file for complete search history.

(56) References Cited

U.S. PATENT DOCUMENTS

2013/0341597 A1* 12/2013 Kim, Hak-Gyu ............... 257/40

FOREIGN PATENT DOCUMENTS

| JP | 2007-053331 (A) | 3/2007 |
|---|---|---|
| KR | 10-2007-0019358 A | 2/2007 |
| KR | 10-0707614 B1 | 4/2007 |
| KR | 10-2008-0045414 (A) | 5/2008 |
| KR | 10-0831308 B1 | 5/2008 |
| KR | 10-0879858 B1 | 1/2009 |
| KR | 10-2009-0090547 A | 8/2009 |
| KR | 10-2013-0089513 (A) | 8/2013 |

OTHER PUBLICATIONS

Korean Office Action dated Sep. 24, 2013 for Korean Patent Application No. KR 10-2012-0068028 which corresponds to captioned U.S. Appl. No. 13/654,317.

* cited by examiner

*Primary Examiner* — Mark Prenty
(74) *Attorney, Agent, or Firm* — Knobbe, Martens Olson & Bear, LLP (57) ABSTRACT

An organic light emitting diode (OLED) display including a display panel, a chip on film, and a printed circuit (PCB) is disclosed. In one embodiment, the display panel includes a display area having an OLED and a pixel circuit, and a pad area in an outer side of the display area. The chip on film is connected to the pad area, is bent toward a non-luminescent surface of the display panel, and include an integrated circuit chip. The PCB includes at least a part overlapping with the chip on film in an outer side of the non-luminescent surface of the display panel, and an opening for receiving the integrated circuit.

15 Claims, 7 Drawing Sheets

ORGANIC LIGHT EMITTING DIODE DISPLAY

RELATED APPLICATIONS

This application claims priority to and the benefit of Korean Patent Application No. 10-2012-0068028 filed in the Korean Intellectual Property Office on Jun. 25, 2012, and entire contents of which are incorporated herein by reference.

BACKGROUND

1. Field

The described technology generally relates to an organic light emitting diode (OLED) display, more particularly, to an OLED display including a chip on film (COF) and a printed circuit board (PCB).

2. Description of the Related Technology

An OLED display includes a display panel having an OLED and a pixel circuit therein, a chip on film (COF) fixed to a pad area of the display panel, and a PCB connected to a pad unit of the COF to be electrically connected to a panel assembly through the COF. The PCB includes a connector for receiving external signals and electronic devices for processing driving signals.

SUMMARY

One inventive aspect is an OLED display having advantages of reducing the entire length of a chip on film and a PCB to increase the capacity of a battery and to manufacture a thin-profile electronic device.

Another aspect is an OLED display which includes a display panel, a chip on film (COF), and a printed circuit board (PCB). The display panel includes a display area having an organic light emitting diode (OLED) and a pixel circuit, and a pad area in an outer side of the display area. The chip on film is connected to the pad area and is bent toward a non-luminescent surface of a display panel, and includes an integrated circuit chip. The PCB includes at least a part overlapping with the chip on film in an outer side of the non-luminescent surface of the display panel, and an opening for receiving an integrated circuit chip.

The PCB is located closer to the display panel than the chip on film in the outer side of the non-luminescent surface of the display panel, and an integrated circuit chip may be located toward the display panel.

The PCB may include an overlapping area having a pad unit for being connected to the chip on film and overlapping with the chip on film and a component mounting area non-overlapping with the chip on film, and mounted with electronic devices.

The pad unit may be located in a center of the PCB along a first direction to which the chip on film and the PCB are connected, and the opening may be formed in the overlapping area of the PCB. Adhesive tapes are respectively provided in upper and lower surfaces of an end of an overlapping area located far away from the pad unit such that a PCB may be fixed to the display panel and the chip on film.

Meanwhile, the chip on film is located closer to the display panel than the PCB in the outer side of a non-luminescent surface, and the integrated circuit chip may be located toward to the outside of the display panel.

The chip on film may include a film layer, first metal wires provided on one surface of the film layer, second metal wires provided on another surface of the film layer and connected to the first metal wires through a via hole formed in the film layer, and an insulation layer covering a part of the first metal wires and a part of the second metal wires.

A portion of the first metal wires and a portion of the second metal wires which are exposed without being covered by the insulation layer constitute a first pad unit and a second pad unit, respectively, and the first pad unit may be connected to the pad area.

The integrated circuit chip is directly connected to the second metal wires, and the chip on film is bent toward the non-luminescent surface of the display panel such that the integrated circuit chip and the second pad unit may be located in the outer side of the non-luminescent surface of the display panel.

The PCB may include an overlapping area having a pad unit connected to a second pad unit and a component mounting area non-overlapping with the chip on film, and mounted with electronic devices The opening is located in the overlapping area, and the electronic devices may be further mounted between the pad unit and the integrated circuit chip in the overlapping area.

Meanwhile, an entire portion of the PCB may overlap the chip on film, and the PCB may include a pad unit connected to the second pad unit. The pad unit is located at an end of the PCB such that a remaining region of the PCB except for a region in which the pad unit is provided may function as a component mounting area.

An adhesive tape is located between the chip on film and the display area in the outer side of the non-luminescent surface of the display panel so that the chip on film may be fixed to the display panel. The adhesive tape is located between the chip on film and the PCB in a side of the integrated circuit chip such that the PCB may be fixed to the chip on film.

DETAILED DESCRIPTION

Generally, a chip on film (COF) is bent toward a non-luminescent surface of an OLED display panel such that a printed circuit board (PCB) is located at an outer side of the non-luminescent surface of the display panel. The COF is generally fixed to the display panel on the non-luminescent surface of the display panel via an adhesive tape, and integrated circuit chip mounted on the COF is located toward the display panel. The PCB overlaps with the COF in the pad unit, and includes electronic devices for processing the driving signals provided at a portion that does not overlap with the COF.

In the foregoing structure, since the adhesion tape, the integrated circuit chip, the pad unit, and the electronic devices are located in a line along one direction, the entire length of the COF and the PCB is increased. This makes it difficult to increase battery capacity and to make a thin battery in an electronic device (for example, a portable terminal or a laptop computer, etc.) including the OLED display.

Hereinafter, embodiments will be described with reference to the accompanying drawings.

Parts irrelevant to a description are omitted and like reference numbers designate like constituent elements through the specification. Further, the size and thickness of each configuration shown in the drawings are optionally illustrated for better understanding and ease of description, the present disclosure is not limited to the illustrated drawings.

In the drawings, the thickness of layers, regions, etc., may be exaggerated for clarity. Furthermore, the thicknesses of partial layers and regions may be exaggerated for better understanding and ease of description.

It will be understood that when an element such as a layer, film, region, or substrate is referred to as being "over" or "on" another element, it can be directly on the other element or intervening elements may also be present.

Figure 1:
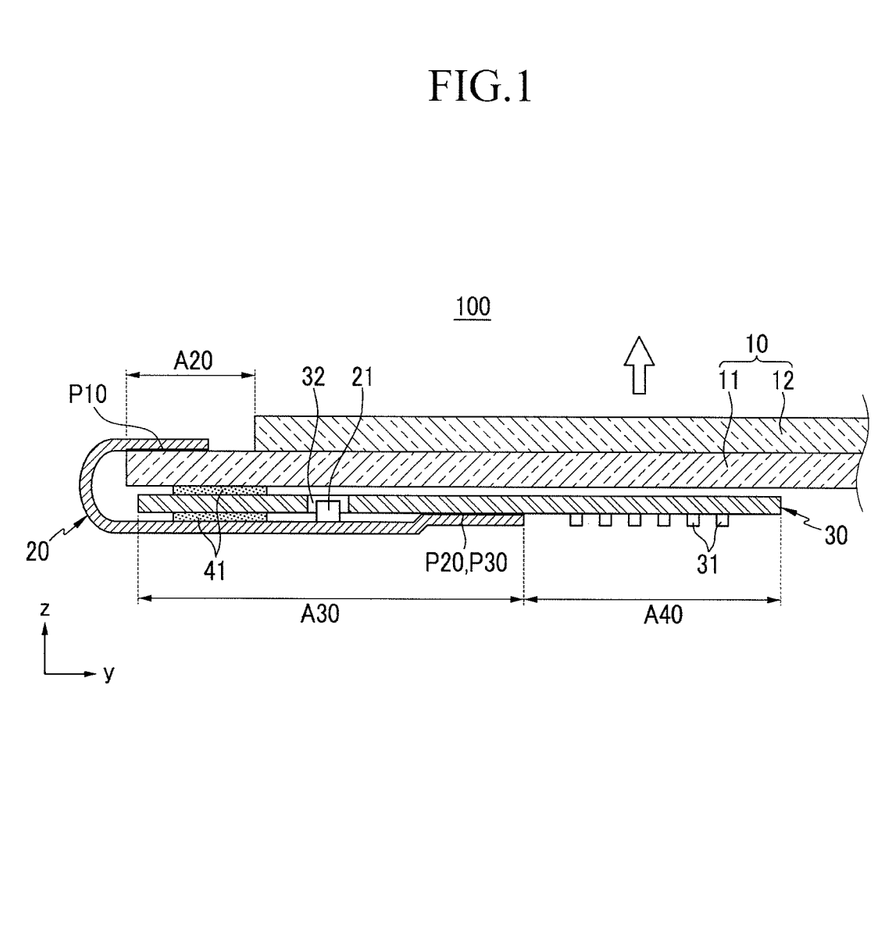
FIG. 1 is a partial cross-sectional view of an organic light emitting diode (OLED) display according to a first embodiment.
Figure 2:
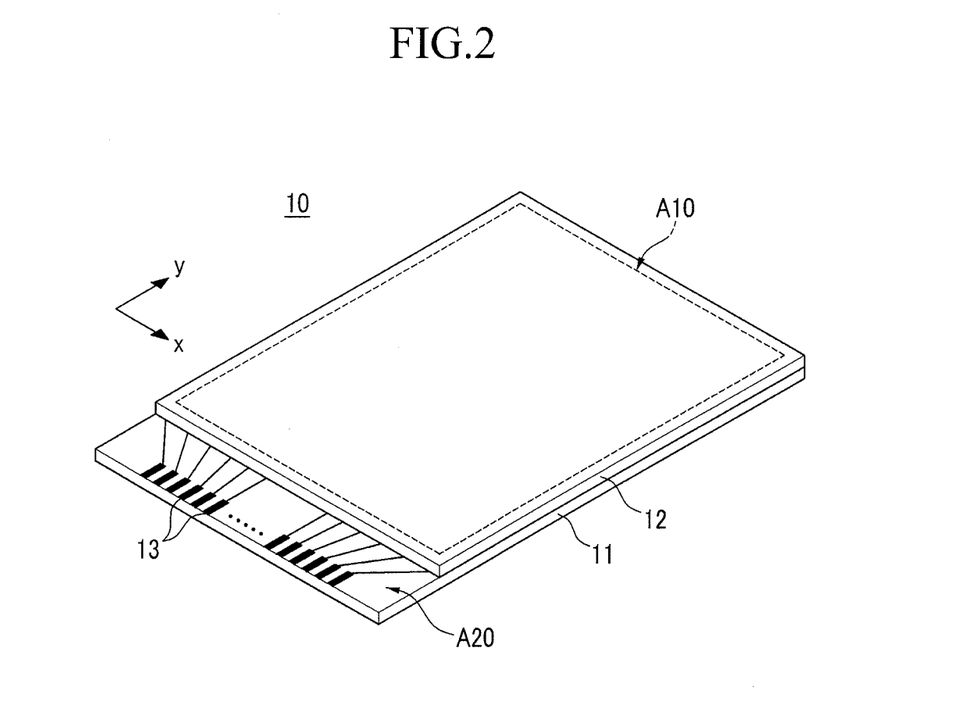
FIG. 2 is a perspective view of a display panel shown in FIG. 1.

FIG. 1 is a partial cross-sectional view of an organic light emitting diode (OLED) display according to a first embodiment, and FIG. 2 is a perspective view of a display panel shown in FIG. 1.

Referring to FIG. 1 and FIG. 2, the organic light emitting diode (OLED) display 100 of the first embodiment includes a display panel having a display area A10 and a pad area A20, a chip on film (COF) 20 fixed to the pad area A20, an a printed circuit board (PCB) 30 fixed to the chip on film 20 to be electrically connected to the display panel 10 through the chip on film 20.

The display panel 10 includes a substrate 11 and an encapsulation substrate 12 overlapping with the substrate 11, having the size smaller than that of the substrate 11, and thereby exposing the pad area A20 of the substrate 11. The display area A10 on which an actual image is displayed is located in an overlapping area between the substrate 11 and the encapsulation substrate 12, and the pad area A20 is located in an outer side of the display area A10.

An OLED and a pixel circuit are provided in the display area A10 of the substrate 11. An internal structure of the display panel 10 will be described below. The encapsulation substrate 12 encapsulates the display area A10 to protect the OLED from external water and oxygen. Pad electrodes 13 are located in the pad area A20 of the substrate 11, each of which is connected to one of gate wires and data wires disposed in the display area A10.

The substrate 11 and the encapsulation substrate 12 may be made of glass. In this case, a sealant is located between the substrate 11 and the encapsulation substrate 12 to bond the two substrates 11 and 12 to each other. The display panel 10 may be received in a bezel or the like which is not shown to be protected from external impact. Meanwhile, the substrate 11 may be a flexible plastic film, and the encapsulation substrate 12 may be configured by a thin film sealing layer layered alternately with an inorganic film and an organic film at least one more time.

The display panel 10 includes a luminescent surface which emits light and a non-luminescent surface which does not emit light. When the display panel 10 is a top emission type, an outer surface of the encapsulation substrate 12 becomes a luminescent surface. When the display panel 10 is a bottom emission type, an outer surface of substrate 11 becomes the luminescent surface. An arrow shown in FIG. 1 indicates a direction to which light is emitted. FIG. 1 illustrates a case where the outer surface of the encapsulation substrate 12 is the luminescent surface, and the outer surface of the substrate 11 is a non-luminescent surface by way of example.

Although not shown in FIG. 1, a polarizing plate suppressing reflection of external light may be located in the outer surface of the encapsulation substrate 12. The polarizing plate may be configured by a linear polarizing layer and a phase delay layer (¼ wavelength layer).

Figure 3:
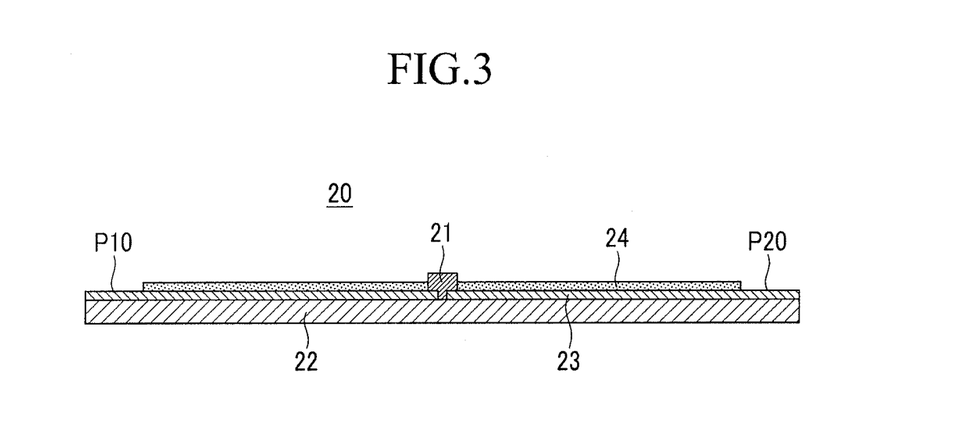
FIG. 3 is a cross-sectional view illustrating a spread out state of a chip on film shown in FIG. 1.

The chip on film 20 includes an integrated circuit chip 21 and metal wires. FIG. 3 is a cross-sectional view illustrating a spread out state of a chip on film shown in FIG. 1.

Referring to FIG. 3, the chip one film 20 includes a film layer 22, metal wires 23 and the integrated circuit chip 21 formed on the film layer 22, and an insulation layer 24 covering a part of the metal wires 23. The integrated circuit chip 21 may include a source driving integrated circuit chip. A portion of metal wires 23 which are exposed without being covered by the insulation layer 24 constitutes the first pad unit P10 and the second pad unit P20 of the chip on film 20. The first pad unit P10 and the second pad unit P20 are located on the same plane of the chip on film 20.

Referring to FIG. 1 and FIG. 3, the first pad unit P10 of the chip on film 20 adheres to the pad area A20 of the display panel 10 by using an anisotropic conductive film (not shown) or the like. Accordingly, the electrodes 13 of the pad area A20 are electrically connected to metal wires 23 of the chip on film 20, respectively.

Electronic devices 31 for processing driving signals are mounted on the PCB 30, and a connector (not shown) for transmitting external signals to the PCB 30 is provided in the PCB 30. Further, the PCB 30 includes metal wires (not shown) and a pad unit P30 to which a part of the metal wires are exposed.

The pad unit P30 of the PCB 30 at least partially overlaps with the second pad unit P20 of the chip on film 20, and adheres to the second pad unit P20 by using an anisotropic conductive film. Accordingly, each of metal wires of the PCB 30 is electrically connected to each of the metal wires 23 of the chip on film 20. The PCB 30 receives and processes the external signals, and the chip on film 20 provides the driving signals received from the PCB 30 to the display panel 10.

The chip on film 20 is bent toward the non-luminescent surface of the display panel 10 such that the PCB 30 is located in the outer side of the non-luminescent surface of the display panel 10. When the display panel 10 is the top emission type, the chip on film 20 is bent toward a rear surface of the substrate 11 along a side of the substrate 11. The PCB 30 is located closer to the display panel 10 than the chip on film 20 in the outer side of the non-luminescent surface of the display panel 10, and the integrated circuit chip 21 is located toward the display panel 10.

The pad unit 30 is not provided at an end of the PCB 30 but is formed apart from the end of the PCB 30 by a predetermined distance. Accordingly, a part of the PCB 30 including the pad unit P30 at least partially overlaps with the chip on film 20. That is, the PCB 30 is divided into an overlapping area A30 having the pad unit P30 overlapping with the chip on film 20, and a component mounting area A40 non-overlapping with the chip on film 20 and mounted with electronic devices 31.

The pad unit P30 may be located in a center of the PCB 30 along a first direction (y-axis direction of FIG. 1) in which the chip on film 20 and the PCB 30 are connected. An opening 32 is formed in a position corresponding to the integrated circuit chip 21 of the chip on film 20 in the overlapping area A30 of the PCB 30. Accordingly, the integrated circuit chip 21 does not come into contact with the PCB 30 but is received in the opening 32, and the chip on film 20 may maintain flatness in an outer side of the display panel 10.

Assuming that the PCB 30 overlaps with the integrated circuit chip 21 not to form the opening 32, the integrated circuit chip 21 come into contact with the PCB 30, and the chip on film 20 is outwardly transformed into a convex form in the vicinity where the integrated circuit chip 21 is formed. The transformed portion of the chip on film 20 adversely affects assembling of the OLED display and the electronic device. However, in the OLED display 100, the chip on film 20 maintains the flatness, thereby not influencing assembling of the OLED display 100 and the electronic device.

A loosening phenomenon may occur in the overlapping area A30 of the PCB 30 due to a gap between the display panel 10 and the chip on film 20. To prevent this, a pair of adhesive tapes 41 are provided at an end of the overlapping area A30 located far away from the pad unit P30, respectively. The adhesive tapes 41 are disposed between the display panel 10 and the overlapping area A30 and between the chip on film 20 and the overlapping area A30, respectively, to firmly fix the overlapping area A30 of the PCB 30 and the chip on film 20 to the display panel 10.

As described above, the PCB 30 has the overlapping area A30, and is provided therein with an opening 32 for receiving the integrated circuit chip 21, so that an entire length of the chip on film 20 and the PCB 30 can be reduced. That is, because a pad unit is provided at an end of the PCB, as compared with a conventional structure (not necessarily prior art) in which a chip on film and a PCB overlap each other in only a pad unit, an entire length of the chip on film 20 and the PCB 30 may be reduced by the overlapping area A30 of the PCB 30.

Figure 4:
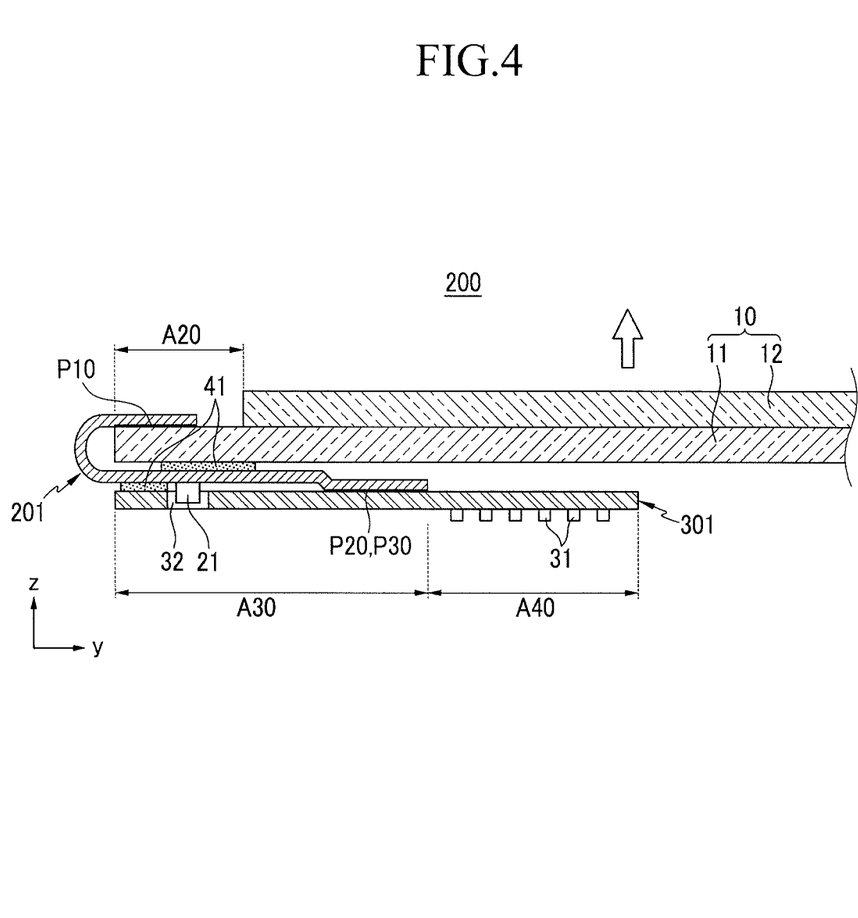
FIG. 4 is a partial cross-sectional view of an organic light emitting diode (OLED) display according to a second embodiment.
Figure 5:
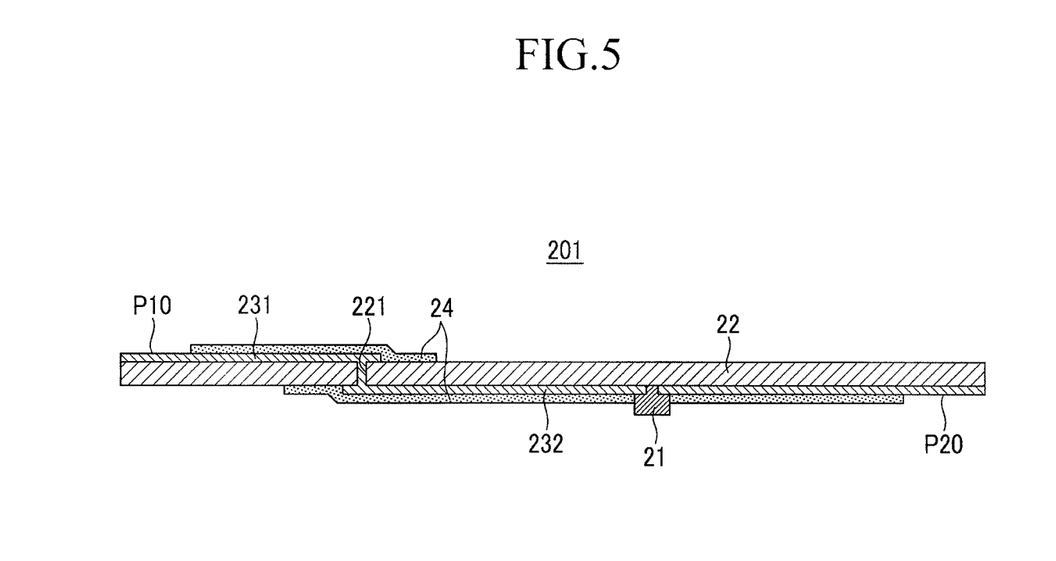
FIG. 5 is a cross-sectional view illustrating a spread out state of a chip on film shown in FIG. 4.

FIG. 4 is a partial cross-sectional view of an OLED display according to a second embodiment, and FIG. 5 is a cross-sectional view illustrating a spread out state of a chip on film shown in FIG. 4.

Referring to FIG. 4 and FIG. 5, in the OLED display 200, the chip on film 201 is located closer to the display panel 10 than a PCB 301 in an outer side of the non-luminescent surface of the display panel 10, and an integrated circuit chip 21 may be located toward the display panel 10. Constituent elements of the second embodiment corresponding to those of the first embodiment are designated by the same reference numerals, and constituent elements other than those of the first embodiment will be mainly described below.

The chip on film 201 has a structure in which the first pad unit P10 and the second pad unit P20 are located on surfaces opposite to each other. In detail, the chip on film 201 includes a film layer 22, first metal wires 231 provided in one surface of the film layer 22, second metal wires 232 connected to the first metal wires 231 through a via hole 221 formed in the film layer 22, and insulation layers 24 covering a part of the first metal wires 231 and a part of the second metal wires 232.

A portion of first metal wire 231 and a portion of second metal wire 232 which are exposed without being covered by the insulation layer 24 constitute the first pad unit P10 and the second pad unit P20 of the chip on film 20, respectively. The integrated circuit chip 21 is directly connected to the second metal wires 232.

The first pad unit P10 is fixed to the pad area A20 of the display panel 10, and the chip on film 201 is bent toward a non-luminescent surface of the display panel 10 such that the integrated circuit chip 21 and the second pad unit P20 are located in an outer side of the non-luminescent surface of the display panel 10. Both of the integrated circuit chip 21 and the second pad unit P20 of the chip on film 201 are located toward the outer side of the non-luminescent surface of the display panel 10. That is, the integrated circuit chip 21 and the second pad unit P20 are located toward a direction away from the display panel 10.

The PCB 301 is divided into an overlapping area A30 having a pad unit P30 and a component mounting area A40 non-overlapping with the chip on film 201 mounted with electronic devices 31. An opening 32 is formed in a position corresponding to an integrated circuit chip 21 in an overlapping area A30 of the PCB 30 and receives the integrated circuit chip 21. Further, electronic devices 31 may be further mounted between the pad unit P30 and the integrated circuit chip 21 in the overlapping area A30.

In the second embodiment, because the PCB 301 is located farther away from the display panel 10 than the chip on film 201, and electronic devices 31 may be mounted on the overlapping area A30 of the PCB 301. Accordingly, a part of electronic devices 31 provided in the PCB 301 are disposed in the overlapping area A30 so that the length of the component mounting area A40 may be reduced as compared with the first embodiment. As a result, an entire length of the PCB 301 and the chip on film 201 along a first direction (y-axis direction) can be efficiently reduced.

An adhesive tape 41 is located between the chip on film 201 and the display panel 10 in an outer side of a non-luminescent surface of the display panel 10. Moreover, the adhesive tape 41 may be located between the chip on film 201 and the PCB 301 at one side end of the integrated circuit chip 21. The chip on film 201 is firmly fixed to the display panel 10 by the adhesive tape 41, and the PCB 301 is also stably fixed to the chip on film 201 by the adhesive tape 41.

Figure 6:
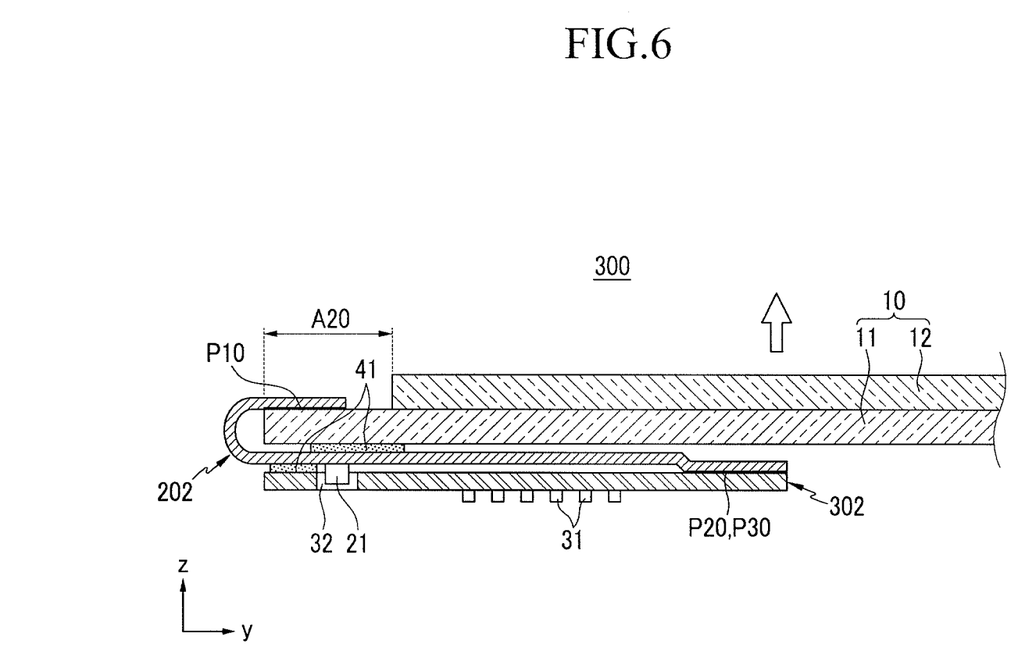
FIG. 6 is a partial cross-sectional view of an organic light emitting diode (OLED) display according to a third embodiment.

FIG. 6 is a partial cross-sectional view of an OLED display according to a third embodiment. Referring to FIG. 6, in the OLED display 300 of the third embodiment, an entire portion of a PCB 302 overlaps with a chip on film 202. Constituent elements of the third embodiment corresponding to those of the second embodiment are designated by the same reference numerals, and constituent elements other than those of the second embodiment will be mainly described below.

The chip on film 202 has substantially the same configuration as that of the second embodiment. The difference is that the chip on film 202 has a length larger than that of the chip on film 201 of the second embodiment overlapping with the entire portion of a PCB 302. The chip on film 202 includes a first pad unit P10 and a second pad unit P20 located on surfaces opposite to each other, and the first pad unit P10 and the second pad unit P20 are located at an end of the chip on film 202.

A pad unit P30 of the PCB 302 is located at an end of the PCB 302, and a remaining region of the PCB 302 except for a formation region of the pad unit P30 becomes a component mounting area. The PCB 302 has an opening 32 for receiving the integrated circuit chip 21. As the pad unit P30 of the PCB 302 is located at an end of the PCB 302, when pressure is applied to the chip on film 202 and the PCB 302 to bond the chip on film 202 and the PCB 302 to each other, a bonding process can be easily performed.

That is, when the pad unit P30 is located in a center of the PCB 302, a pressure pad (not shown) for compression needs to be located in the center of the PCB 302. However, in the third embodiment, since the pad unit P30 is located at an end of the PCB 302, the pressure pad may be easily installed and removed.

Accordingly, the OLED display 300 of the third embodiment may reduce an entire length of the PCB 302 and the chip on film 202 and easily perform a compressing process of the PCB 302 and the chip on film 202 at the same time.

Figure 7:
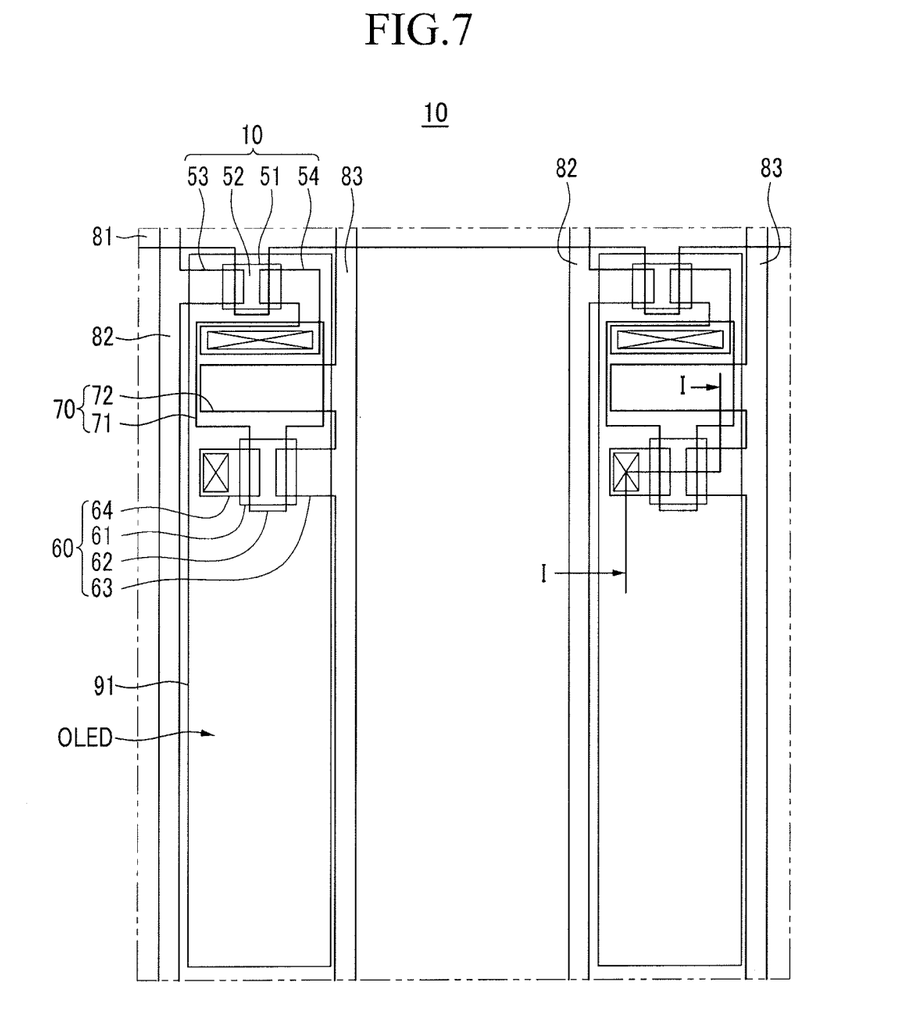
FIG. 7 is a layout view illustrating a pixel structure of the display panel shown in FIG. 1.
Figure 8:
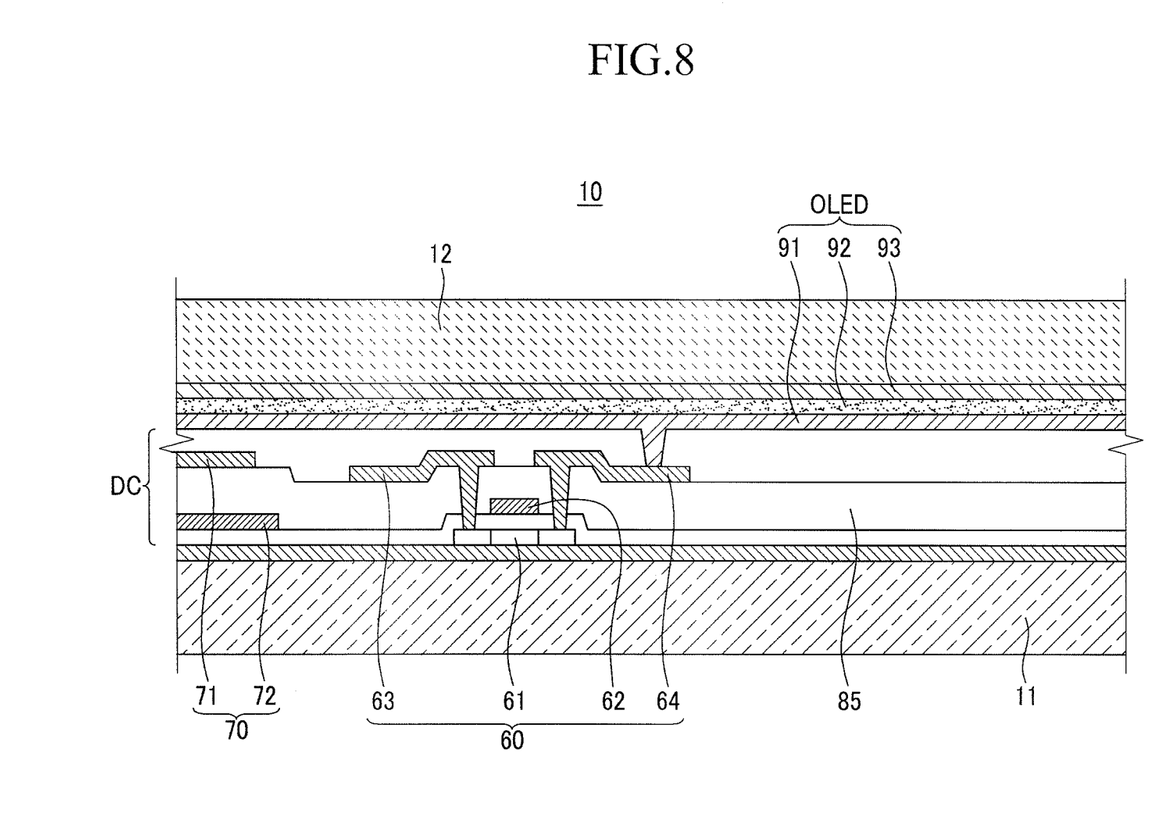
FIG. 8 is a cross-sectional view of the display panel taken along line I-I of FIG. 7.

FIG. 7 is a layout view illustrating a pixel structure of the display panel shown in FIG. 1, and FIG. 8 is a cross-sectional view of the display panel taken along line I-I of FIG. 7.

Referring to FIG. 7 and FIG. 8, the display panel 10 includes a pixel circuit DC and an organic light emitting diode (OLED) provided for each pixel. The pixel circuit (DC) fundamentally includes a switching thin film transistor 50, a driving thin film transistor 60, and a capacitor 70. Further, the display panel 10 includes a gate line 81 disposed in one direction, a data line 82 and a common power line 83 insulated from the gate line 81 while crossing the gate line.

Here, although one pixel may be defined by the gate line 81, the data line 82, and the common power line 83, the present invention is not limited thereto. The pixel refers to a base unit displaying an image, and the display panel 10 displays the image through a plurality of pixels.

Although FIG. 7 illustrates an active matrix type display panel 10 having a two-transistor one capacitor (2Tr-1Cap) structure including two thin film transistors 50 and 60 and one capacitor 70, the structure of the display panel 10 is not limited to the shown example. The display panel 10 may be provided in various structures, which includes at least three thin film transistors and at least two capacitors, and further includes a separate wire.

The OLED includes a pixel electrode 91, an organic emission layer 92, and a common electrode 93. One of the pixel electrode 91 and the common electrode 93 is a hole injection electrode, and the other of the pixel electrode 91 and the common electrode 93 is an electron injection electrode. Electrons and holes are injected from the pixel electrode 91 and the common electrode 93 to the organic emission layer 92, respectively, and light emission is achieved when an excitation generated by coupling of holes and electrons falls from an exited state to a ground state within the organic luminescent layer 92.

The pixel electrode 91 may be made of high reflectivity metal, and the common electrode 93 may be configured by a transparent conductive layer. In this case, light of the organic emission layer 92 is reflected from the pixel electrode 91, and is transmitted through common electrode 93 and the encapsulation substrate 12, and is discharged to the outside.

The capacitor 70 includes a pair of capacitor electrodes 71 and 72 disposed while interposing an interlayer insulating layer 85 being a dielectric material. Storage capacity is determined by an electric charge stored in the capacitor 70 and a voltage between the two capacitor electrodes 71 and 72.

A switching thin film transistor 50 includes a switching semiconductor layer 51, a switching gate electrode 52, switching source electrode 53, and a switching drain electrode 54. A thin film transistor 60 includes a driving semiconductor layer 61, a driving gate electrode 62, a drive source electrode 63, and a driving drain electrode 64.

The switching thin film transistor 50 is used as a switch selecting a pixel for emitting light. The switching gate electrode 52 is connected to a gate line 81. The switching source electrode 53 is connected to a data line 82, and the switching drain electrode 54 is connected to one capacitor electrode 71.

The driving thin film transistor 60 applies driving power for emitting light from an organic emission layer 92 of a selected pixel to the pixel electrode 91. The driving gate electrode 62 is connected to the capacitor electrode 71 connected to the switching drain electrode 54. The drive source electrode 63 and another capacitor electrode 72 are connected to a common power line 83. The drive drain electrode 64 is connected to the pixel electrode of the OLED through a contact hole.

The switching thin film transistor 50 operates according to a gate voltage applied to the gate line 81 and transfers a data voltage applied to the data line 82 to the driving thin film transistor 60. A voltage corresponding to voltage difference between a common voltage applied from the common power line 83 to the driving thin film transistor 60 and the data voltage provided from the switching thin film transistor 50 is stored in the capacitor 70, and an electric current corresponding to the voltage stored in the capacitor 70 flows into the OLED through the driving thin film transistor 60, so that the organic emission layer 92 emits light.

According to at least one of the disclosed embodiments, the entire length of the chip on film and the PCB may be reduced. Accordingly, in an electronic device including the organic light emitting diode (OLED) display, battery capacity is increased and thin-profile electronic devices are easily realized.

While this disclosure has been described in connection with the accompanying drawings, it is to be understood that the present disclosure is not limited to the above embodiments, but, on the contrary, is intended to cover various modifications and equivalent arrangements included within the spirit and scope of the appended claims.

What is claimed is:

1. An organic light emitting diode (OLED) display comprising:
 a display panel including a display area having an OLED and a pixel circuit, and a pad area in an outer side of the display area;
 a chip on film connected to the pad area and bent toward a non-luminescent surface of the display panel, wherein the chip on film includes an integrated circuit chip; and
 a printed circuit board (PCB) at least partially overlapping with the chip on film in an outer side of the non-luminescent surface of the display panel, wherein the PCB has an opening configured to receive the integrated circuit.

2. The OLED display of claim 1, wherein the PCB is located closer to the display panel than the chip on film in the outer side of the non-luminescent surface of the display panel, and wherein the integrated circuit chip extends toward the display panel.

3. The OLED display of claim 2, wherein the PCB comprises:
 an overlapping area including a pad unit configured to be connected to the chip on film and at least partially overlapping with the chip on film; and
 a component mounting area that does not overlap with the chip on film, and that is mounted with electronic devices.

4. The OLED display of claim 3, wherein the pad unit is located in the center of the PCB along a first direction to which the chip on film and the PCB are connected, and
 and wherein the opening is formed in the overlapping area of the PCB.

5. The OLED display of claim 3, wherein adhesive tapes are respectively provided in upper and lower surfaces of an end of the overlapping area spaced apart from the pad unit such that the PCB is fixed to the display panel and the chip on film.

6. The OLED display of claim 1, wherein the chip on film is located closer to the display panel than the PCB in the outer side of the non-luminescent surface of the display panel, and
 wherein the integrated circuit chip extends away from the display panel.

7. The OLED display of claim 6, wherein the chip on film comprises:
   a film layer;
   a first plurality of metal wires provided on one surface of the film layer;
   a second plurality of metal wires provided on another surface of the film layer and connected to the first metal wires through a via hole formed in the film layer; and
   an insulation layer covering a part of the first metal wires and a part of the second metal wires.

8. The OLED display of claim 7, wherein a portion of the first metal wires and a portion of the second metal wires which are exposed without being covered by the insulation layer constitute a first pad unit and a second pad unit, respectively, and
   wherein the first pad unit is connected to the pad area.

9. The OLED display of claim 8, wherein the integrated circuit chip is directly connected to the second metal wires, and
   wherein the chip on film is bent toward the non-luminescent surface of the display panel such that the integrated circuit chip and the second pad unit are located in the outer side of the non-luminescent surface of the display panel.

10. The OLED display of claim 9, wherein the PCB comprises,
    an overlapping area including a pad unit connected to the second pad unit;
    a component mounting area that does not overlap with the chip on film, and that is mounted with electronic devices.

11. The OLED display of claim 10, wherein the opening is located in the overlapping area, and
    wherein the electronic devices are further mounted between the pad unit and the integrated circuit chip in the overlapping area.

12. The OLED display of claim 9, wherein the entire portion of the PCB at least partially overlaps with the chip on film, and
    wherein the PCB comprises a pad unit connected to the second pad unit.

13. The OLED display of claim 12, wherein the pad unit is located at an end of the PCB such that the remaining region of the PCB, except for a region occupied by the pad unit, functions as a component mounting area.

14. The OLED display of claim 10, wherein an adhesive tape is located between the chip on film and the display area in the outer side of the non-luminescent surface of the display panel so that the chip on film is fixed to the display panel.

15. The OLED display of claim 14, wherein the adhesive tape is located between the chip on film and the PCB in a side of the integrated circuit chip such that the PCB is fixed to the chip on film.

* * * * *